US008558215B2

(12) United States Patent  
Son

(10) Patent No.: US 8,558,215 B2  
(45) Date of Patent: Oct. 15, 2013

(54) LIGHT EMITTING DEVICE, LIGHT EMITTING DEVICE PACKAGE, METHOD OF MANUFACTURING LIGHT EMITTING DEVICE AND LIGHTING SYSTEM

(75) Inventor: Hyo Kun Son, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 239 days.

(21) Appl. No.: 12/883,314

(22) Filed: Sep. 16, 2010

(65) Prior Publication Data

US 2011/0147700 A1   Jun. 23, 2011

(30) Foreign Application Priority Data

Dec. 22, 2009   (KR) .................... 10-2009-0129335

(51) Int. Cl.
*H01L 33/04*   (2010.01)

(52) U.S. Cl.
USPC ................... 257/13; 257/14; 257/15; 257/17; 257/22; 257/79; 257/96; 257/97; 257/98; 257/103; 257/E33.005; 257/E33.067

(58) Field of Classification Search
USPC ............... 257/13, 14, 15, 17, 22, 79, 98, 103, 257/E33.005, E33.067
See application file for complete search history.

(56) References Cited

U.S. PATENT DOCUMENTS

| 5,998,925 A * | 12/1999 | Shimizu et al. ............... 313/503 |
| 7,649,195 B2 * | 1/2010 | Lee et al. ......................... 257/13 |
| 8,124,990 B2 * | 2/2012 | Kim et al. ....................... 257/96 |
| 2007/0085097 A1 * | 4/2007 | Kim et al. ....................... 257/94 |
| 2008/0217632 A1 | 9/2008 | Tomiya et al. |
| 2008/0237570 A1 | 10/2008 | Choi et al. |
| 2008/0308787 A1 | 12/2008 | Lee et al. |
| 2009/0050875 A1 | 2/2009 | Kim et al. |
| 2009/0278113 A1 | 11/2009 | Chung et al. |
| 2010/0046205 A1 * | 2/2010 | Chu et al. ..................... 362/97.1 |

FOREIGN PATENT DOCUMENTS

| CN | 101055906 | 10/2007 |
| JP | 10-65271 | 3/1998 |
| JP | 10-289877 | 10/1998 |
| JP | 11-74621 | 3/1999 |
| JP | 2004-31770 | 1/2004 |
| JP | 2004-179493 | 6/2004 |
| JP | 2008-252096 | 10/2008 |
| JP | 2008-311658 | 12/2008 |

(Continued)

OTHER PUBLICATIONS

Japanese Office Action for JP1035255P dated Mar. 5, 2013.

*Primary Examiner* — Matthew W Such  
*Assistant Examiner* — David Spalla  
(74) *Attorney, Agent, or Firm* — KED & Associates, LLP

(57) ABSTRACT

A light emitting device may include a first conductive semiconductor layer, an active layer adjacent to the first conductive semiconductor layer and a second conductive semiconductor layer adjacent to the active layer. The active layer may include a first quantum well layer, a second quantum well layer and a barrier layer between the first quantum well layer and the second quantum well layer. The first quantum well layer may include a first plurality of sub-barrier layers and a first plurality of sub-quantum well layers, and the second quantum well layer may include a second plurality of sub-barrier layers and a second plurality of sub-quantum well layers. A bandgap of the first quantum well layer may be different than a bandgap of the second quantum well layer.

23 Claims, 11 Drawing Sheets

(56) References Cited

FOREIGN PATENT DOCUMENTS

| JP | 2009/55023 | 3/2009 |
| JP | 2009-272606 | 11/2009 |
| KR | 2004-0044701 | 5/2004 |
| KR | 10-2008-0033666 | 4/2008 |
| KR | 2009-0010622 | 1/2009 |
| KR | 10-2009-0019252 | 2/2009 |
| KR | 10-2009-0053550 | 5/2009 |
| WO | WO 2005/020396 | 3/2005 |

* cited by examiner

LIGHT EMITTING DEVICE, LIGHT EMITTING DEVICE PACKAGE, METHOD OF MANUFACTURING LIGHT EMITTING DEVICE AND LIGHTING SYSTEM

CROSS-REFERENCE TO RELATED APPLICATION

The present application claims priority under 35 U.S.C. §119(a) from Korean Patent Application No. 10-2009-0129335, filed Dec. 22, 2009, the subject matter of which is hereby incorporated by reference.

BACKGROUND

1. Field

Embodiments may relate to a light emitting device.

2. Background

A light emitting diode (LED) is a semiconductor light emitting device that converts current into light. The LED has been employed as a light source for a display device, a vehicle, and/or a lighting device. Additionally, the LED may represent a white color having superior light efficiency by employing phosphors and/or combining LEDs having various colors.

In order to improve brightness and/or performance of the LED, attempts have been performed to improve a light extraction structure, an active layer structure, a current diffusion, an electrode structure, and a structure of a light emitting diode package.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
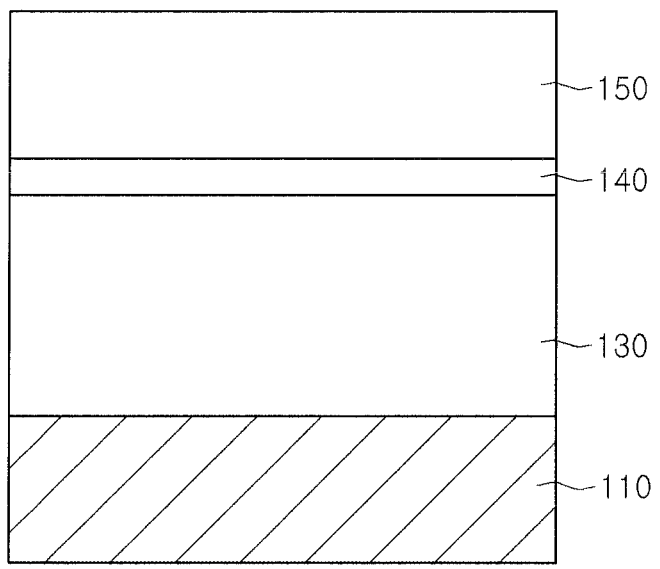
FIG. 1 is a sectional view showing a light emitting device according to an embodiment.

In the following description, it is understood that when a layer (or film), a region, a pattern, and/or a structure is referred to as being "on", "under" or "adjacent" another substrate, another layer (or film), another region, another pad, and/or another pattern, it may be "directly" or "indirectly" on the other substrate, layer (or film), region, pad, and/or pattern, and/or one or more intervening layers may also be present. Such a position of the layer may be described with reference to the drawings.

Thickness and size of each layer shown in the drawings may be exaggerated, omitted and/or schematically drawn for ease of convenience or clarity. Additionally, the size of elements may not reflect an actual size.

A light emitting device, a light emitting device package, a method of manufacturing the light emitting device, and a lighting system according to embodiments may be described with reference to the accompanying drawings.

Figure 2:
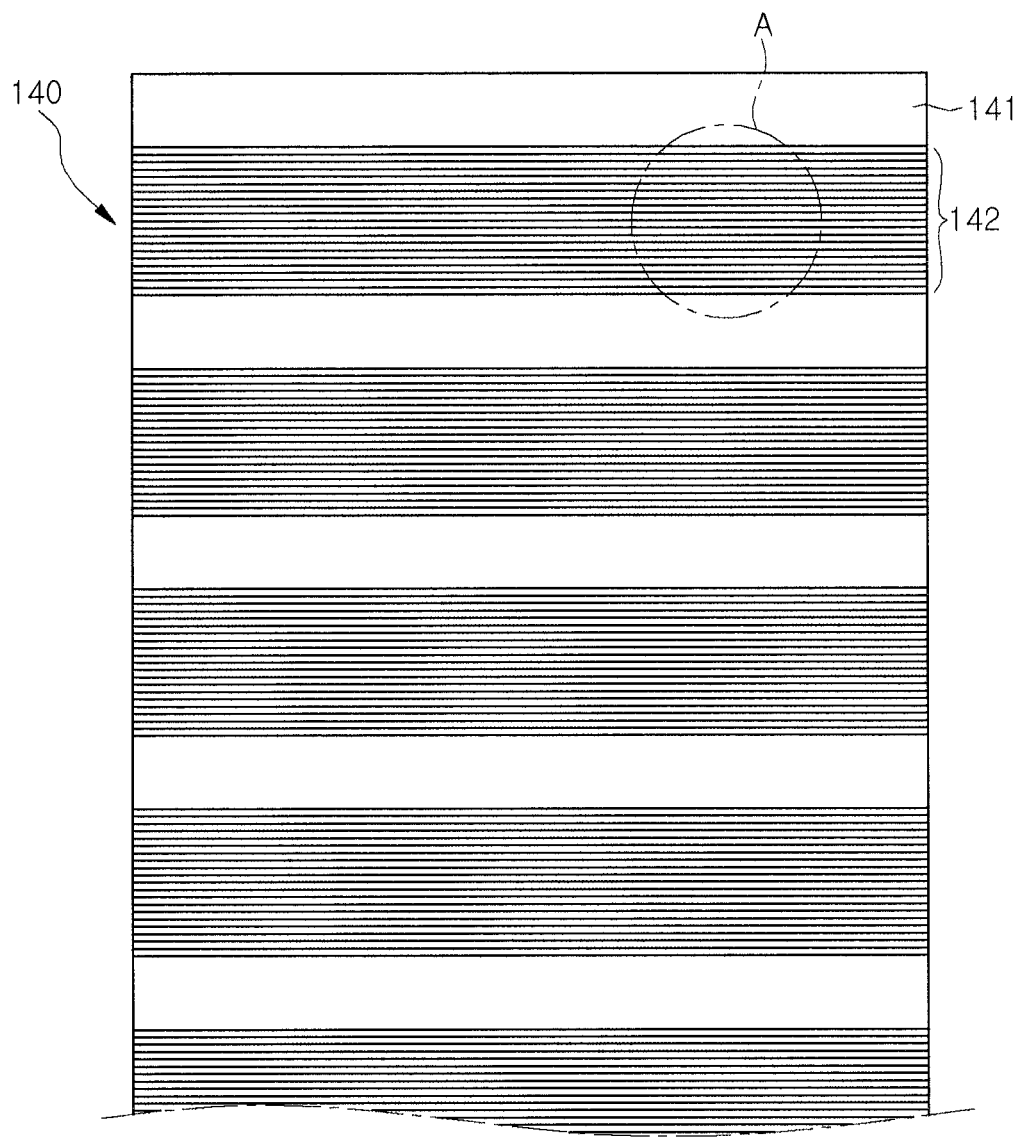
FIG. 2 is a sectional view showing an active layer of a light emitting device according to an embodiment.

FIG. 1 is a sectional view showing a light emitting device according to an embodiment. FIG. 2 is a sectional view showing an active layer 140 of a light emitting device according to an embodiment. Other embodiments and configurations are also within the scope of embodiments.

As shown in FIGS. 1 and 2, a light emitting device 100 may include a substrate 110, a first conductive semiconductor layer 130 on the substrate 110, an active layer 140 on the first conductive semiconductor layer 130, and a second conductive semiconductor layer 150 on the active layer 140.

The first conductive semiconductor layer 130, the active layer 140 and the second conductive semiconductor layer 150 may form a light emitting structure for generating light.

The substrate 110 may include at least one selected from the group consisting of $Al_2O_3$, SiC, Si, GaAs, GaN, ZnO, Si, GaP, InP, and Ge, although embodiments are not limited thereto.

The first conductive semiconductor layer 130, the active layer 140 and the second conductive semiconductor layer 150 may be sequentially formed on the substrate 110 through metal organic chemical vapor deposition (MOCVD), chemical vapor deposition (CVD), plasma-enhanced chemical vapor deposition (PECVD), molecular beam epitaxy (MBE), and/or hydride vapor phase epitaxy (HVPE) scheme, although embodiments are not limited thereto.

For example, the first conductive semiconductor layer 130 may include an n type semiconductor layer. The n type semiconductor layer may include semiconductor material having a compositional formula of $In_xAl_yGa_{1-x-y}N$ ($0 \leq x \leq 1$, $0 \leq y \leq 1$, $0 \leq x+y \leq 1$). For example, the n type semiconductor layer may include one selected from the group consisting of InAlGaN, GaN, AlGaN, InGaN, AlN, and InN. Additionally, the n type semiconductor layer may be doped with n type dopant, such as Si, Ge and/or Sn.

If the first conductive semiconductor layer 130 is formed through the MOCVD scheme, the first conductive semiconductor layer 130 may be formed by injecting at least one of trimethyl gallium (TMGa) gas, trimethyl indium (TMIn) gas, trimethyl aluminum (TMAl) gas, ammonia ($NH_3$) gas, nitrogen ($N_2$) gas and hydrogen ($H_2$) gas into a chamber together with silane ($SiH_4$) gas including n type dopant, such as Si, although embodiments are not limited thereto.

A buffer layer (not shown) and an undoped semiconductor layer (not shown) may be formed between the first conductive semiconductor layer 130 and the substrate 110 to attenuate lattice mismatch between the first conductive semiconductor layer 130 and the substrate 110.

The buffer layer may include a semiconductor material having the compositional formula of $In_xAl_yGa_{1-x-y}N$ ($0 \leq x \leq 1$, $0 \leq y \leq 1$, $0 \leq x+y \leq 1$). For example, the buffer layer may include one of InAlGaN, GaN, AlGaN, InGaN, AlN, and/or InN.

The undoped semiconductor layer may include a semiconductor material having the compositional formula of $In_xAl_yGa_{1-x-y}N$ ($0 \leq x \leq 1$, $0 \leq y \leq 1$, $0 \leq x+y \leq 1$). For example, the undoped semiconductor layer may include an undoped GaN layer, although embodiments are not limited thereto.

The active layer 140 may be formed on the first conductive semiconductor layer 130.

Electrons (or holes) injected through the first conductive semiconductor layer 130 may be recombined with the holes (or electrons) injected through the second conductive semiconductor layer 150 at the active layer 140 while generating energy so that the active layer 140 may emit light.

The active layer 140 may include a semiconductor material having the compositional formula of $In_xAl_yGa_{1-x-y}N$ ($0 \le x \le 1$, $0 \le y \le 1$, $0 \le x+y \le 1$). Additionally, the active layer 140 may have a single quantum well structure, a multiple quantum well (MQW) structure, and/or a quantum dot structure. According to this embodiment, the active layer 140 may have the multiple quantum well (MQW) structure.

As shown in FIG. 2, if the active layer 140 has the MQW structure or the single quantum well structure, the active layer 140 may have at least one barrier layer 141 and at least one quantum well layer 142. That is, the active layer 140 may have a stack structure including at least one barrier layer 141 and at least one quantum well layer 142 that are alternately stacked.

The stack structure including at least one barrier layer 141 and at least one quantum well layer 142 may be repeatedly formed by five to ten times, and preferably seven times.

The barrier layer 141 may have a thickness of approximately 80 Å to 120 Å, and/or preferably 100 Å. The quantum well layer 142 may have a thickness of approximately 20 Å to 30 Å, and preferably 250 Å. Thus, the active layer 140 may have a total thickness of approximately 800 Å to 1500 Å.

If the active layer 140 is formed through the MOCVD scheme, the active layer 140 may be formed by injecting trimethyl gallium (TMGa) gas, trimethyl indium (TMIn) gas, ammonia ($NH_3$) gas, and/or nitrogen ($N_2$) gas into a chamber such that the active layer 140 may have the MQW structure in which at least one barrier layer 141 and at least one quantum well layer 142 are prepared as the InGaN/GaN structure, although embodiments are not limited thereto.

Since at least one barrier layer 141 and at least one quantum well layer 142 are provided, recombination probability of electrons and holes may be increased as compared with the single quantum well structure so that light emitting efficiency of the light emitting device may be improved.

According to this embodiment, the at least one quantum well layer 142 may have a multiple structure. The quantum well layer 142 having the multiple structure and method of manufacturing the same may be described below in detail.

Figure 3:
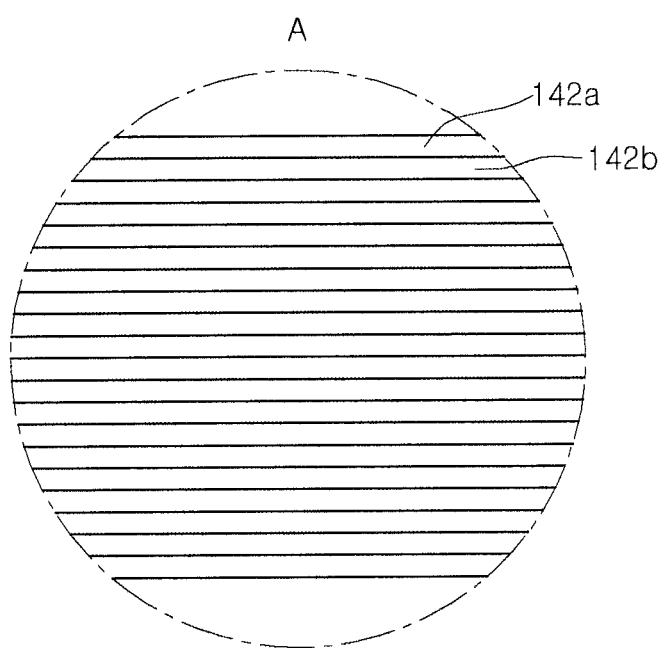
FIG. 3 is an enlarged view of an "A" region (FIG. 2)

FIG. 3 is an enlarged view of an "A" region (FIG. 2) for illustrating the multiple structure of the quantum well layer 142.

The quantum well layer 142 may include a plurality of sub-barrier layers 142a, and a plurality of sub-quantum well layers 142b aligned alternately with the sub-barrier layers 142a. That is, the sub-barrier layers 142a and the sub-quantum well layers 142b may be alternately stacked.

For example, the sub-barrier layers 142a may include a semiconductor material having the compositional formula of $In_{x1}Ga_{1-x1}N$ ($0 \le x1 < 0.1$) and the sub-quantum well layers 142b may include a semiconductor material having the compositional formula of $In_{x2}Ga_{1-x2}N$ ($0.1 \le x2 < 1$).

The sub-barrier layer 142a may have a thickness of approximately 1 Å to 4 Å, and preferably 1 Å to 2 Å, and/or more preferably 1.5 Å. The sub-quantum well layer 142b may have a thickness of approximately 0.5 Å to 3 Å, and preferably 0.5 Å to 1.5 Å, and/or more preferably 1 Å.

The stack structure including the sub-barrier layer 142a and the sub-quantum well layers 142b may be repeatedly formed five to fifteen times, and preferably ten times.

Since the sub-barrier layer 142a and the sub-quantum well layers 142b having the above thickness may be repeatedly formed, the active layer 140 may have a thickness similar to an active layer of the light emitting device.

The thickness, the number of stack structures and material of the sub-barrier layer 142a and the sub-quantum well layers 142b may vary depending on intensity and wavelength of light emitted from the light emitting device, although embodiments are not limited thereto.

The quantum well layer 142 of the active layer 140 may include indium (In), and a greater amount of pits may be formed as a ratio (or amount) of indium (In) included in the quantum well layer 142 is increased so that a surface of the quantum well layer 142 is roughly formed. The quantum well layer 142 having the rough surface may cause leakage current, thereby degrading crystal property of semiconductor layers formed on the quantum well layer 142.

The quantum well layer 142 may include the sub-barrier layers 142a and the sub-quantum well layers 142b, thereby reducing leakage current caused by the quantum well layer 142 having the rough surface.

After forming the sub-quantum well layer 142b, the sub-barrier layer 142a, which has a smooth surface because it has a relatively smaller amount of indium (In), may be stacked on the sub-quantum well layer 142b to attenuate surface roughness of the sub-quantum well layer 142b. The sub-quantum well layer 142b may then be stacked again on the sub-barrier layer 142a, thereby reducing leakage current caused by the quantum well layer 142 having the rough surface.

Since surface roughness of the quantum well layer 142 is attenuated, the second conductive semiconductor layer 150 may be formed on the active layer 140 with superior crystal property.

Additionally, since the sub-quantum well layers 142b and the sub-barrier layers 142a may be alternately stacked, indium (In) included in the sub-quantum well layers 142b may penetrate into the sub-barrier layers 142a. As a result, the indium (In) may be uniformly distributed in the quantum well layer 142 without being excessively included in the quantum well layer 142 so that light emitting efficiency of the light emitting device may be improved.

Figure 4:
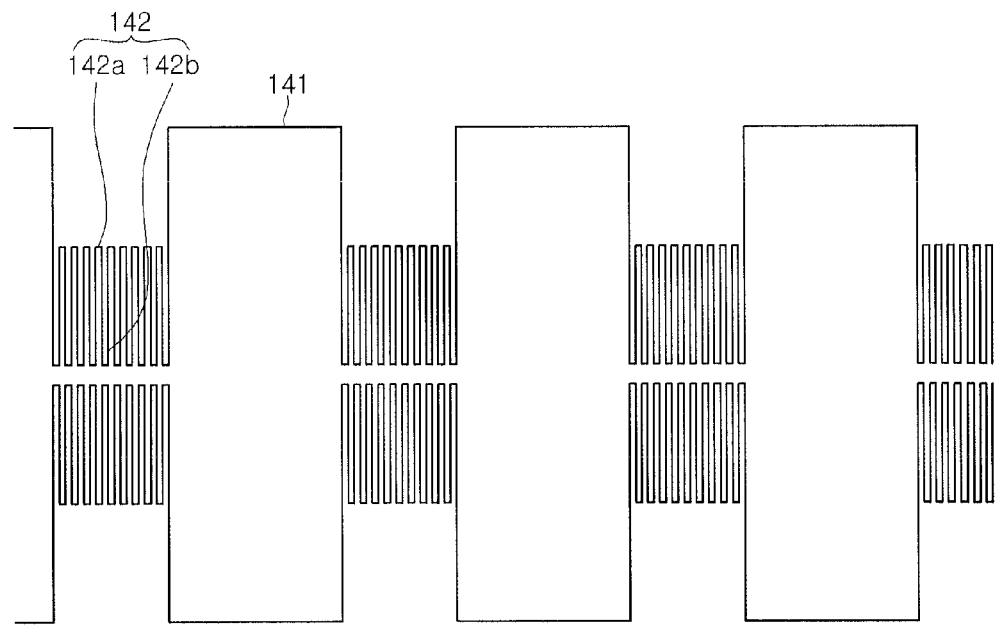
FIG. 4 is a band diagram of an active layer of a light emitting device.

FIG. 4 shows a band diagram of an active layer of a light emitting device. Other arrangements and configurations may also be provided.

As shown in FIG. 4, a bandgap of a region corresponding to at least one barrier layer 141 in the active layer 140 may be greater than a bandgap of a region corresponding to at least one quantum well layer 142 that includes the sub-barrier layers 142a and the sub-quantum well layers 142b.

The amount of indium (In) included in the sub-barrier layers 142a may be smaller than the amount of indium (In) included in the sub-quantum well layers 142b even in the same quantum well layer 142, so the bandgap of the region corresponding to the sub-barrier layers 142a may be greater than the bandgap of the region corresponding to the sub-quantum well layers 142b.

Referring to the band diagram for the light emitting device, the bandgap may be repeatedly changed in the same quantum well layer 142 so that recombination probability of electrons and holes passing through the quantum well layer 142 may increase, and so that light emitting efficiency of the light emitting device may be improved.

Similar to other semiconductor layers, the quantum well layer 142 may be fabricated through metal organic chemical vapor deposition (MOCVD), chemical vapor deposition (CVD), plasma-enhanced chemical vapor deposition (PECVD), molecular beam epitaxy (MBE), and/or hydride vapor phase epitaxy (HVPE) scheme.

If the quantum well layer 142 is formed through the MOCVD scheme, the quantum well layer 142 may be formed by injecting trimethyl gallium (TMGa) gas, trimethyl indium (TMIn) gas, ammonia ($NH_3$) gas, and/or nitrogen ($N_2$) gas into the chamber. The growth temperature of the quantum well layer 142 may be approximately 680° C. to 800° C., and preferably approximately 750° C. to 770° C.

A flow rate of the trimethyl indium (TMIn) gas injected into the chamber may vary depending on stacking sequence of the sub-quantum well layers 142b. For ease of convenience, the following description may be made based on the assumption that the sub-quantum well layers 142b are stacked by ten times and divided into first to tenth sub-quantum well layers according to the stacking sequence thereof.

For example', when the first sub-quantum well layer is grown, 500 cc of TMIn gas may be injected into the chamber. Additionally, other sub-quantum well layers may be stacked on the first sub-quantum well layer by sequentially reducing the amount of TMIn gas by 10 cc according to the stacking sequence of the sub-quantum well layers. The first to tenth sub-quantum well layers may be formed by injecting TMIn gas into the chamber in the amount of 500 cc, 490 cc, 480 cc, 470 cc, 460 cc, 450 cc, 440 cc, 430 cc, 420 cc, and 410 cc, respectively.

The flow rate of the TMIn gas injected into the chamber may be gradually reduced according to stacking sequence of the sub-quantum well layers 142b because the sub-quantum well layers 142b containing the indium (In) may be easily grown on the rough surface.

In other words, the sub-quantum well layers 142b, which are stacked later, may be grown on the rough surface due to the pits caused by the indium (In) so the sub-quantum well layers 142b may be easily grown as compared with the sub-quantum well layers 142b that are previously stacked.

Although it has been described that the flow rate of the TMIn may gradually reduce to form the sub-quantum well layers 142, configurations and/or embodiments are not limited thereto. Additionally, the flow rate of the TMIn may be gradually increased to form the sub-quantum well layers 142. If the sub-quantum well layers 142b have the same amount of indium (In), a same energy bandgap may be formed theoretically. However, the first sub-quantum well layer may have a greatest amount of indium (In) and the amount of indium (In) may be gradually decreased according to the stacking sequence of the sub-quantum well layers. Thus, the energy bandgap may be gradually widened so that the first to tenth sub-quantum well layers may generate wavelengths different from each other, causing degradation of color purity. Therefore, if the amount of indium (In) injected into the sub-quantum well layers 142b increases such that the sub-quantum well layers 142b have a same amount of indium (In), color purity may be improved.

Figure 5A:
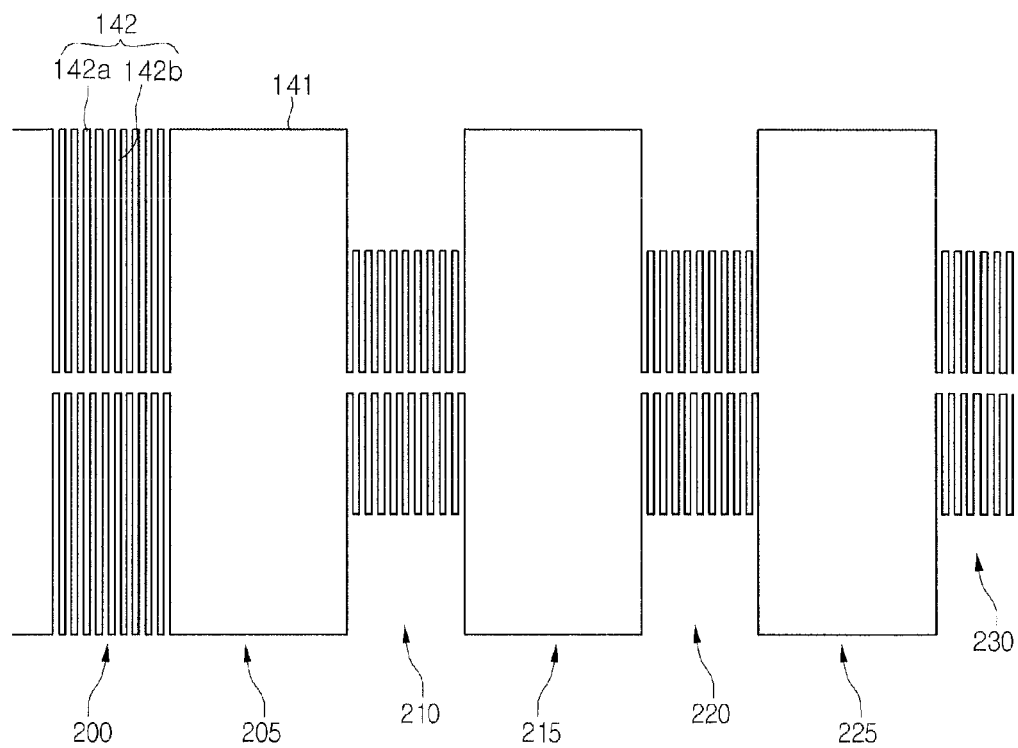
FIGS. 5A-5C are band diagrams of an active layer of a light emitting device according to embodiments.

FIG. 5A shows a band diagram of an active layer of a light emitting device according to an embodiment. Other embodiments and configurations may also be provided.

FIG. 5A shows a plurality of quantum well layers 200, 210, 220 and 230 and a plurality of barrier layers 205, 215, 225.

The sub-barrier layers 142a of the quantum well layer 200 (or the quantum well layer 142) adjacent to the first conductive semiconductor layer 130 may not include the indium (In) and the sub-quantum well layers 142b may include the indium (In). If the sub-barrier layers 142a do not include the indium (In), height of the bandgap of the sub-barrier layers 142a may be identical to height of the barrier layer 205, as shown in FIG. 5A.

FIG. 5A also shows that a bandgap of the quantum well layer 210 is less than a bandgap of the quantum well layer 200 (and less than a bandgap of the barrier layer 205).

Since the sub-barrier layers 142a of the quantum well layer 200 adjacent to the first conductive semiconductor layer 130 may not include the indium (In) having a lattice constant greater than gallium (Ga), a crystal property of the barrier layer may be improved so that leakage current can be minimized and reliability can be improved.

The amount of indium included in the sub-barrier layers of one quantum well layer may be different from the amount of indium included in the sub-barrier layers of another quantum well layer.

Figure 5B:
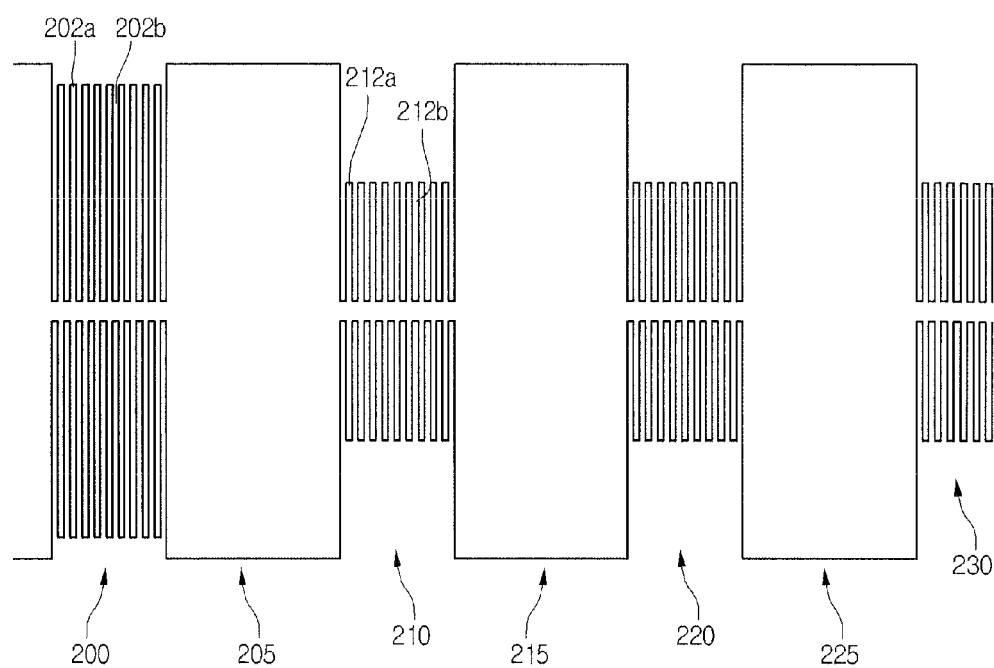

For example, FIG. 5B shows the plurality of barrier layers 205, 215 and 225 as well as the plurality of quantum well layers 200, 210, 220 and 230. As shown in FIG. 5B, the quantum well layer 200 includes a plurality of sub-barrier layers 202a and a plurality of sub-quantum well layers 202b. The quantum well layer 210 includes a plurality of sub-barrier layer 212a and a plurality of sub-quantum well layer 212b.

The amount of indium included in the sub-barrier layers 202a of the quantum well layer 200, which is closest to the first conductive semiconductor layer 130, may be different from the amount of indium included in the sub-barrier layers 212a of the quantum well layer 210. Additionally, the sub-barrier layers of one quantum well layer, which is closest to the first conductive semiconductor layer, may not include indium.

As shown in FIG. 5B, a bandgap of the plurality of sub-quantum well layers 202b is larger than a bandgap of the plurality of sub-quantum well layers 212b.

Figure 5C:
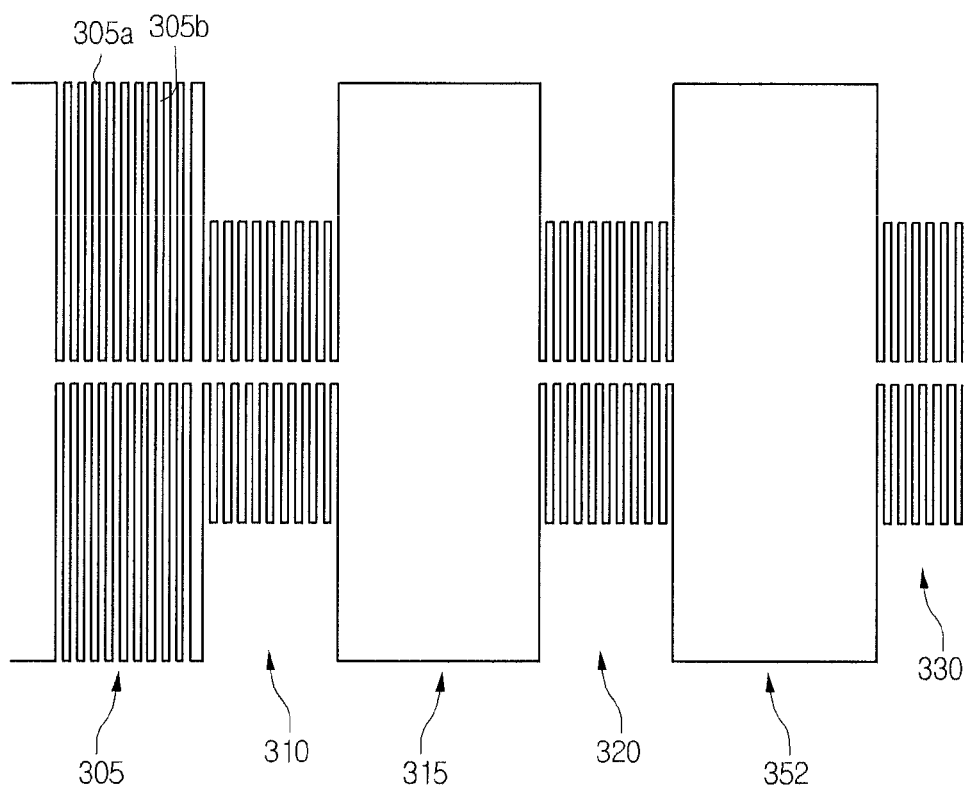

FIG. 5C shows a plurality of barrier layers 305, 315 and 325 and a plurality of quantum well layers 310, 320 and 330. Each of the barrier layers 305, 315 and 325 may include sub-barrier layers 305a and sub-quantum well layers 305b. A bandgap of the barrier layer 305 (having sub-barrier layers 305a and sub-quantum well layer 305b) may be greater than a bandgap of the quantum well layer 310 (or the quantum well layers 320, 330), as shown in FIG. 5C.

Figure 6:
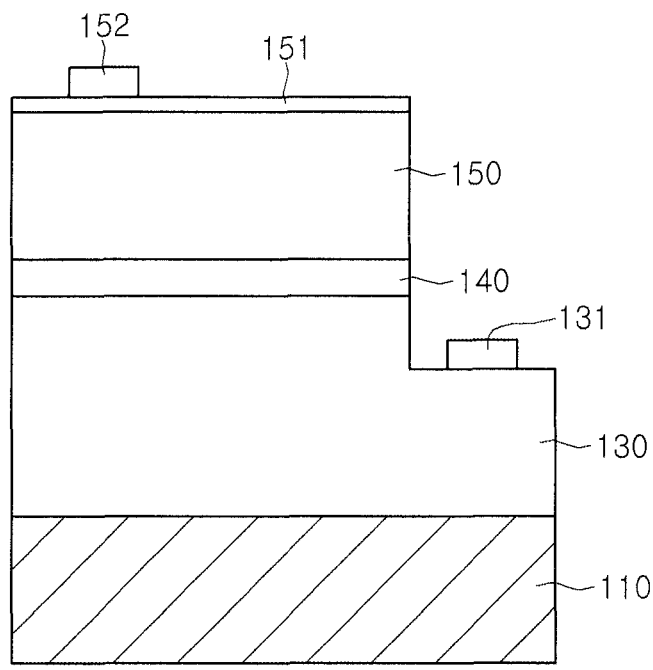
FIG. 6 is a sectional view showing a lateral type light emitting device according to an embodiment.

FIG. 6 is a sectional view showing a lateral type light emitting device according to an embodiment. Other embodiments and configurations may also be provided.

As shown in FIG. 6, the lateral type light emitting device may include the substrate 110, the first conductive semiconductor layer 130 on the substrate 110, the active layer 140 on the first conductive semiconductor layer 130, the second conductive semiconductor layer 150 on the active layer 140, an electrode layer 151 on the second conductive semiconductor layer 150, a first electrode 131 on the first conductive semiconductor layer 130, and a second electrode 152 on the electrode layer 151.

The light emitting device may be mesa-etched such that the first conductive semiconductor layer 130 may be exposed. The first electrode 131 may be formed on the first conductive semiconductor layer 130, and the electrode layer 151 and the second electrode 152 may be formed on the second conductive semiconductor layer 150, thereby forming the lateral type light emitting device.

The first and second electrodes 131 and 152 may be coupled to an external power source to supply power to the lateral type light emitting device. The first and second electrodes 131 and 152 may be formed on or under the first and second conductive semiconductor layers 130 and 150, respectively. The first and second electrodes 131 and 152 may be formed on the first and second conductive semiconductor layers 130 and 150, respectively.

The electrode layer 151 may include a transparent electrode layer and/or a reflective electrode layer.

The transparent electrode layer may include one of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, Ni/IrOx/Au/ITO, and ZnO, although embodiments are not limited thereto.

The reflective electrode layer may include at least one of Ag, Al, Pd, Pt, and Cu having higher reflective efficiency, and/or an alloy thereof, although embodiments are not limited thereto.

Figure 7:
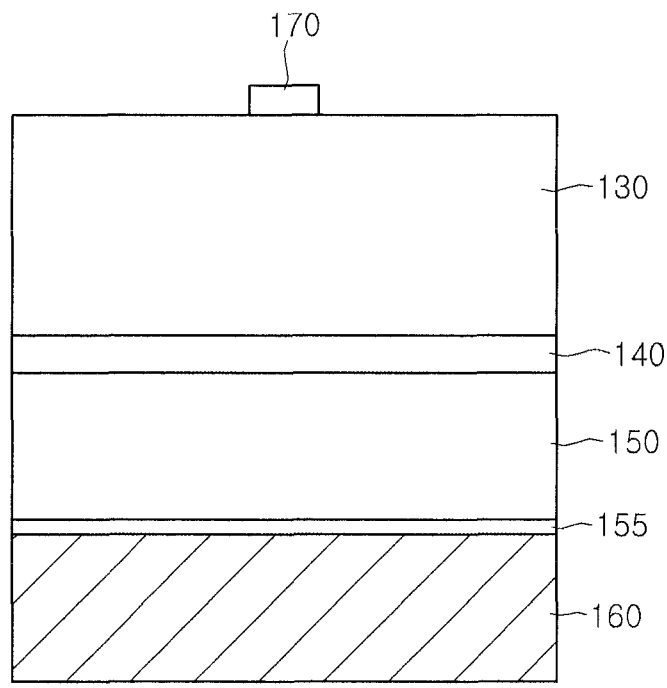
FIG. 7 is a sectional view showing a vertical type light emitting device according to an embodiment.

FIG. 7 is a sectional view showing a vertical type light emitting device according to an embodiment. Other embodiments and configurations may also be provided.

As shown in FIG. 7, the vertical type light emitting device may include a conductive support member 160, a reflective electrode layer 155 on the conductive support member 160, the second conductive semiconductor layer 150 on the reflective electrode layer 155, the active layer 140 on the second conductive semiconductor layer 150, the first conductive semiconductor layer 130, and a third electrode 170 on the first conductive semiconductor layer 130.

When viewed from another direction, the vertical type light emitting device may include the first conductive semiconductor layer 130, the active layer 140 on the first conductive semiconductor layer 130, the second conductive semiconductor layer 150 on the active layer 140, the reflective electrode layer 155 on the second conductive semiconductor layer 150 and the conductive support member 160 on the reflective electrode layer 155.

After forming the reflective electrode layer 155 and the conductive support member 160 on the light emitting device, the substrate (not shown) may be removed and the third electrode 170 may be formed, thereby forming the vertical type light emitting device.

The conductive support member 160 and the third electrode 170 may supply power to the vertical type light emitting device.

The conductive support member 160 may include at least one selected from the group consisting of Ti, Cr, Ni, Al, Pt, Au, W, Cu, Mo and a semiconductor substrate doped with impurities.

The reflective electrode layer 155 may include at least one of Ag, Al, Pd, Pt and Cu having a higher reflective efficiency, and/or an alloy thereof.

The substrate may be removed through a laser lift off process and/or an etching process. After the substrate has been removed, the etching process may be performed to polish a surface of the first conductive semiconductor layer 130. The substrate may include at least one of $Al_2O_3$, SiC, GaAs, GaN, ZnO, Si, GaP, InP, and Ge, although embodiments are not limited thereto.

Light Emitting Device Package

Figure 8:
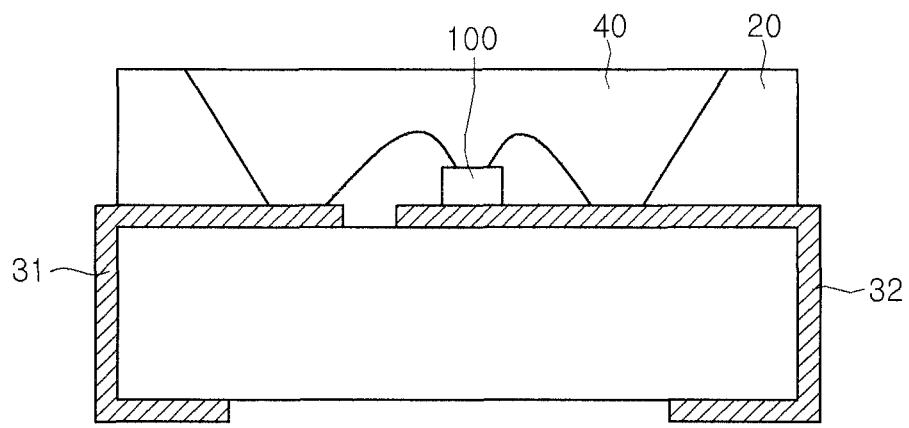
FIG. 8 is a sectional view showing a light emitting device package including a light emitting device according to an embodiment.

FIG. 8 is a sectional view showing a light emitting device package having a light emitting device according to an embodiment. Other embodiments and configurations may also be provided.

FIG. 8 shows that the light emitting device package may include a body 20, first and second electrode layers 31 and 32 formed on the body 20, the light emitting device 100 provided on the body 20 and a molding member 40 that surrounds the light emitting device 100. The light emitting device 100 may be electrically connected to the first and second electrode layers 31 and 32.

The body 20 may include silicon, synthetic resin and/or a metallic material. An inclined surface may be formed around the light emitting device 100.

The first and second electrode layers 31 and 32 may be electrically isolated from each other to supply power to the light emitting device 100. Additionally, the first and second electrode layers 31 and 32 may reflect the light emitted from the light emitting device 100 to improve light efficiency and dissipate heat generated from the light emitting device 100 to the outside.

The light emitting device 100 may be provided on the body 20 and/or the first and second electrode layers 31 and 32.

Although it is shown that the light emitting device 100 is electrically coupled to the first and second electrode layers 31 and 32 through a wire, embodiments are not limited thereto. For example, the light emitting device 100 may be electrically coupled to the first and second electrode layers 31 and 32 through a die bonding scheme or a flip chip scheme.

The molding member 40 may surround the light emitting device 100 to protect the light emitting device 100. Additionally, the molding member 40 may include phosphors to change a wavelength of the light emitted from the light emitting device 100.

Figure 9:
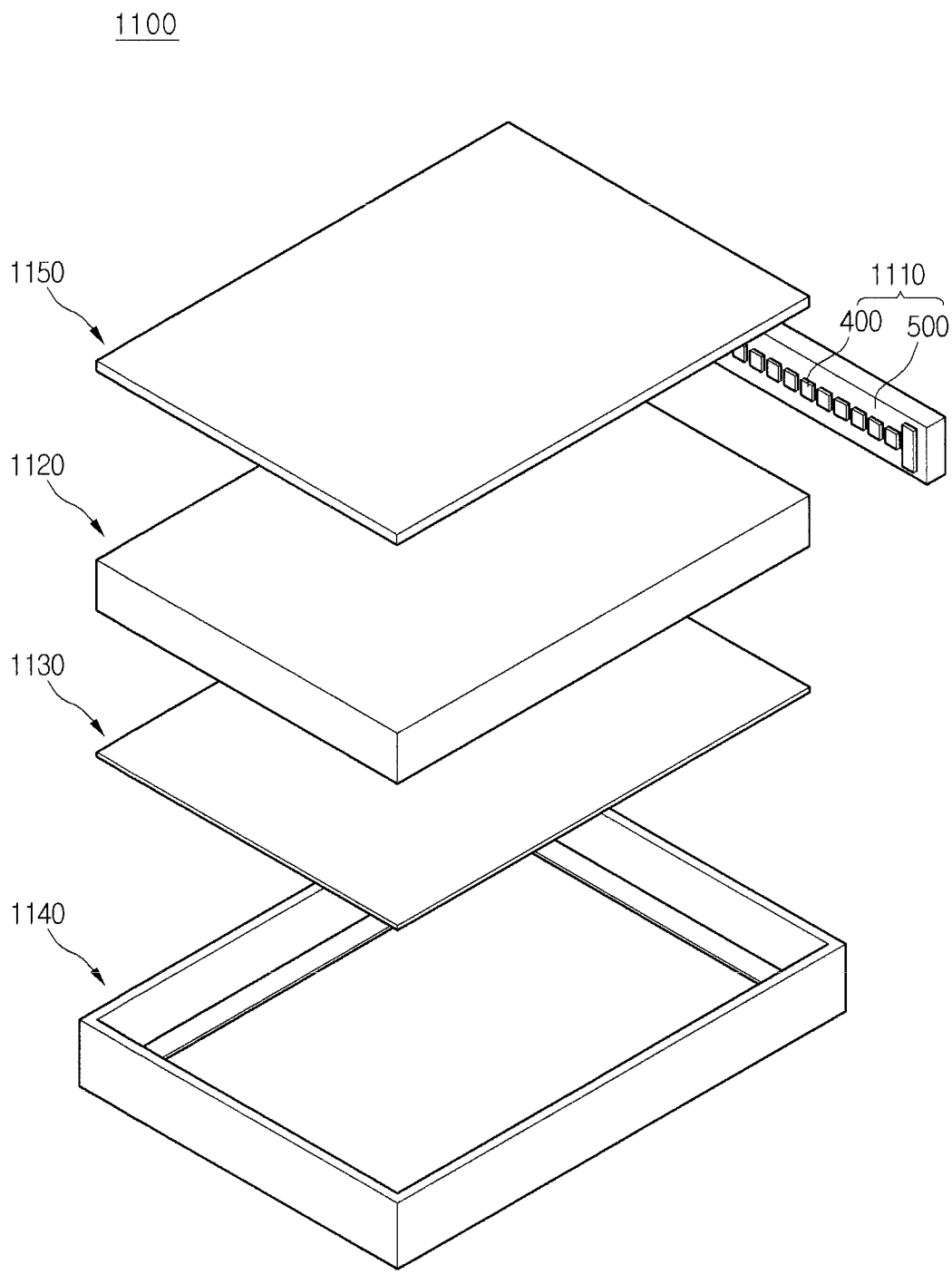
FIG. 9 is an exploded perspective view showing a backlight unit including a light emitting device or a light emitting device package according to an embodiment.

FIG. 9 is an exploded perspective view showing a backlight unit including a light emitting device package according to an embodiment. The backlight unit may be an example of a lighting system, although embodiments are not limited thereto. Other embodiments and configurations may also be provided.

As shown in FIG. 9, a backlight unit 1100 may include a bottom frame 1140, a light guide member 1120 installed in the bottom frame 1140, and a light emitting module 1110 installed on at least one lateral side or bottom surface of the light guide member 1120. Additionally, a reflective sheet 1130 may be provided below the light guide member 1120.

The bottom frame 1140 may have a box shape having a top surface being open to receive the light guide member 1120, the light emitting module 1110 and the reflective sheet 1130 therein. Additionally, the bottom frame 1140 may include a metallic material and/or a resin material, although embodiments are not limited thereto.

The light emitting module 1110 may include a substrate 500 and a plurality of light emitting device packages 400 installed on the substrate. The light emitting device packages 400 may provide light to the light guide member 1120.

As shown in FIG. 9, the light emitting module 1110 may be installed on at least one inner side of the bottom frame 1140 to provide light to at least one side of the light guide member 1120.

Additionally, the light emitting module 1110 may be provided below the bottom frame 1140 to provide the light toward a bottom surface of the light guide member 1120. Such an arrangement may be variously changed according to design of the backlight unit 1100, although embodiments are not limited thereto.

The light guide member 1120 may be provided in the bottom frame 1140. The light guide member 1120 may convert the light emitted from the light emitting module 1110 into surface light to guide surface light toward a display panel (not shown).

The light guide member 1120 may include a light guide plate. For example, the light guide plate may include one selected from the group consisting of acryl-based resin, such as PMMA (polymethyl methacrylate), PET (polyethylene terephthalate), PC (polycarbonate), COC and/or PEN (polyethylene naphthalate) resin.

An optical sheet 1150 may also be provided over the light guide member 1120.

The optical sheet 1150 may include at least one of a diffusion sheet, a light collection sheet, a brightness enhancement sheet, and/or a fluorescent sheet. For example, the optical sheet 1150 may have a stack structure of the diffusion sheet, the light collection sheet, the brightness enhancement sheet, and/or the fluorescent sheet. The diffusion sheet may uniformly diffuse the light emitted from the light emitting module 1110 such that the diffused light may be collected on the display panel by the light collection sheet. The light output from the light collection sheet may be randomly polarized and the brightness enhancement sheet may increase the degree of polarization of the light output from the light collection sheet. The light collection sheet may include a horizontal and/or vertical prism sheet. Additionally, the brightness enhancement sheet may include a dual brightness enhancement film and the fluorescent sheet may include a transmittive plate or a transmittive film including phosphors.

The reflective sheet 1130 may be provided below the light guide member 1120. The reflective sheet 1130 may reflect the light, emitted through the bottom surface of the light guide member 1120 toward the light exit surface of the light guide member 1120.

The reflective sheet 1130 may include resin material having a high reflectivity, such as PET, PC or PVC resin, although embodiments are not limited thereto.

Figure 10:
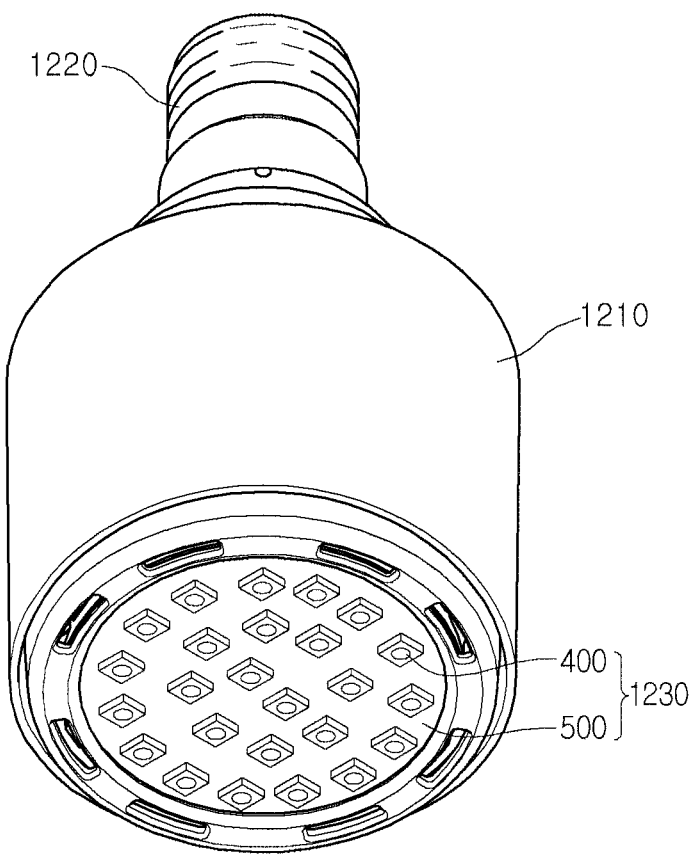
FIG. 10 is a perspective view showing a lighting unit including a light emitting device or a light emitting device package according to an embodiment.

FIG. 10 is a perspective view showing a lighting unit including a light emitting device package according to an embodiment. Other embodiments and configurations may also be provided. The lighting unit shown in FIG. 10 may be an example of a lighting system, although embodiments are not limited thereto.

As shown in FIG. 10, a lighting unit 1200 may include a case body 1210, a light emitting module 1230 installed in the case body 1210, and a connection terminal 1220 installed in the case body 1210 to receive power from an external power source.

The case body 1210 may include material having superior heat dissipation property. For example, the case body 1210 may include a metallic material or a resin material.

The light emitting module 1230 may include a substrate 500 and at least one light emitting device package 400 installed on the substrate 500.

The substrate 500 may include an insulating member printed with a circuit pattern. For example, the substrate 500 may include a PCB (printed circuit board), an MC (metal core) PCB, an F (flexible) PCB, and/or a ceramic PCB.

Additionally, the substrate 500 may include a material that effectively reflects the light. The surface of the substrate 500 may be coated with a color, such as a white color or a silver color, to effectively reflect the light.

At least one light emitting device package 400 may be installed on the substrate 500. Each light emitting device package 400 may include at least one light emitting diode (LED). The LED may include a colored LED that emits light having a color of red, green, blue or white and a UV (ultraviolet) LED that emits UV light.

The LEDs of the light emitting module 1230 may be variously arranged to provide various colors and brightness. For example, the white LED, the red LED and the green LED may be arranged to achieve a high color rendering index (CRI). Additionally, a fluorescent sheet may be provided in a path of the light emitted from the light emitting module 1230 to change wavelength of the light emitted from the light emitting module 1230. For example, if the light emitted from the light emitting module 1230 has a wavelength band of blue light, the fluorescent sheet may include yellow phosphors. The light emitted from the light emitting module 1230 may pass through the fluorescent sheet so that the light is viewed as white light.

The connection terminal 1220 may be electrically connected to the light emitting module 1230 to supply power to the light emitting module 1230. The connection terminal 1220 may have a shape of a socket screw-coupled with the external power source, although embodiments are not limited thereto. For example, the connection terminal 1220 may be prepared in the form of a pin inserted into the external power source or coupled to the external power source through a wire.

According to the illumination system discussed above, at least one of a light guide member, a diffusion sheet, a light collection sheet, a brightness enhancement sheet and a fluorescent sheet may be provided in the path of the light emitted from the light emitting module, so that a desired optical effect can be achieved.

An embodiment may provide a light emitting device having a novel structure, a light emitting device package, a method of manufacturing the light emitting device, and/or a lighting system.

An embodiment may provide a light emitting device capable of improving light emitting efficiency, a light emitting device package, a method of manufacturing the light emitting device, and/or a lighting system.

An embodiment may provide a light emitting device capable of reducing leakage current and a method of manufacturing the same.

A light emitting device may include a first conductive semiconductor layer, an active layer including at least one barrier layer and at least one quantum well layer stacked on the first conductive semiconductor layer, and a second conductive semiconductor layer on the active layer. The at least one quantum well layer may include a plurality of sub-barrier layers, which are divided into first to $n^{th}$ sub-barrier layers sequentially stacked from the first sub-barrier layer, and a plurality of sub-quantum well layers, which are divided into first to $n^{th}$ sub-quantum well layers sequentially stacked from the first sub-quantum well layer and have bandgaps lower than bandgaps of the sub-barrier layers, and wherein the sub-quantum well layers have a region where a ratio of indium (In) injected into the sub-quantum well layers is increased according to a stacking sequence of the sub-quantum well layers.

A method of manufacturing a light emitting device may include forming a first conductive semiconductor layer, forming an active layer including at least one barrier layer and at least one quantum well layer alternately stacked on the first conductive semiconductor layer by injecting at least one of trimethyl gallium (TMGa) gas, trimethyl indium (TMIn) gas, ammonia ($NH_3$) gas and nitrogen ($N_2$) gas into a chamber through a metal organic chemical vapor deposition (MOCVD) process, and forming a second conductive semiconductor layer on the active layer. The at least one quantum well layer may include a plurality of sub-barrier layers and a plurality of sub-quantum well layers having a region where a ratio of TMIn gas injected into a chamber increases according to a stacking sequence of the sub-quantum well layers.

A light emitting device package may include a package body, first and second electrode layers on the package body, and a light emitting device electrically coupled to me first and second electrode layers. The light emitting device may include a first conductive semiconductor layer, an active layer including at least one barrier layer and at least one quantum well layer stacked on the first conductive semiconductor layer, and a second conductive semiconductor layer on the active layer. The at least one quantum well layer may include a plurality of sub-barrier layers, which are divided into first to $n^{th}$ sub-barrier layers sequentially stacked from the first sub-barrier layer, and a plurality of sub-quantum well layers, which are divided into first to $n^{th}$ sub-quantum well layers sequentially stacked from the first sub-quantum well layer and have bandgaps lower than bandgaps of the sub-barrier layers. The sub-quantum well layers may have a region where a ratio of indium (In) injected into the sub-quantum well layers increases according to a stacking sequence of the sub-quantum well layers.

A lighting system may include a light emitting module that includes a substrate and a light emitting device installed on the substrate, wherein the light emitting device comprises: a first conductive semiconductor layer, an active layer including at least one barrier layer and at least one quantum well layer stacked on the first conductive semiconductor layer, and a second conductive semiconductor layer on the active layer. The at least one quantum well layer may include a plurality of sub-barrier layers, which are divided into first to $n^{th}$ sub-barrier layers sequentially stacked from the first sub-barrier layer, and a plurality of sub-quantum well layers, which are divided into first to $n^{th}$ sub-quantum well layers sequentially stacked from the first sub-quantum well layer and have bandgaps lower than bandgaps of the sub-barrier layers, and wherein the sub-quantum well layers have a region where a ratio of indium (In) injected into the sub-quantum well layers increases according to a stacking sequence of the sub-quantum well layers.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first conductive semiconductor layer;
an active layer adjacent to the first conductive semiconductor layer, the active layer including a first quantum well layer, a second quantum well layer and a barrier layer between the first quantum well layer and the second quantum well layer; and
a second conductive semiconductor layer adjacent to the active layer,
wherein the first quantum well layer includes a first plurality of sub-barrier layers and a first plurality of sub-quantum well layers, and the second quantum well layer includes a second plurality of sub-barrier layers and a second plurality of sub-quantum well layers, and
wherein a bandgap of the first plurality of sub-barrier layers is different than a bandgap of the second plurality of sub-barrier layers,
wherein the bandgap of the second plurality of sub-barrier layers is lower than a bandgap of the barrier layer, and
wherein a bandgap of the second plurality of sub-quantum well layers is lower than the bandgap of the second plurality of sub-barrier layers.

2. The light emitting device as claimed in claim 1, wherein the bandgap of the first plurality of sub-barrier layers is larger than the bandgap of the second plurality of sub-barrier layers.

3. The light emitting device as claimed in claim 1, wherein the barrier layer has a thickness of approximately 80 Å to 120 Å, and the first quantum well layer has a thickness of approximately 20 Å to 40 Å.

4. The light emitting device as claimed in claim 1, wherein the sub-barrier layer includes material having a compositional formula of $In_{x1}Ga_{1-x1}N$ ($0 \leq x1 < 0.1$), and the sub-quantum well layer includes material having a compositional formula of $In_{x2}Ga_{1-x2}N$ ($0.1 \leq x2 < 1$).

5. The light emitting device as claimed in claim 1, wherein the sub-barrier layer has a thickness of approximately 1 Å to 4 Å, and the sub-quantum well layer has a thickness of approximately 0.5 Å to 3 Å.

6. The light emitting device as claimed in claim 1, wherein the active layer includes material having a compositional formula of $In_xAl_yGa_{1-x-y}N$ ($0 \leq x \leq 1$, $0 \leq y \leq 1$, $0 \leq x+y \leq 1$).

7. The light emitting device as claimed in claim 1, further comprising a substrate, a first electrode adjacent to the first conductive semiconductor layer, and a second electrode adjacent to the second conductive semiconductor layer, and wherein the first conductive semiconductor layer is adjacent to the substrate.

8. The light emitting device as claimed in claim 1, wherein an amount of indium included in sub-barrier layers of the first quantum well layer is different from an amount of indium included in sub-barrier layers of the second quantum well layer.

9. The light emitting device as claimed in claim 1, wherein the sub-quantum well layers include a first region where an amount of indium is increased and a second region where an amount of indium is decreased.

10. The light emitting device as claimed in claim 1, wherein the first plurality of sub-barrier layers are divided into first to $n^{th}$ sub-barrier layers that are sequentially stacked beginning from the first sub-barrier layer, and the plurality of sub-quantum well layers are divided into first to $n^{th}$ sub-quantum well layers that are sequentially stacked beginning from the first sub-quantum well layer, wherein the sub-quantum well layers have band gaps that are lower than band gaps of the sub-barrier layers.

11. The light emitting device as claimed in claim 10, wherein the sub-quantum well layers have a region where an amount of indium (In) injected into the sub-quantum well layers increases based on a stacking sequence of the sub-quantum well layers.

12. A light emitting device package comprising:
the light emitting device as claimed in claim 1,
a body; and
first and second electrode layers on the body,
wherein the light emitting device is electrically coupled to the first electrode layer and the second electrode layer on the body.

13. A light emitting device package as claimed in claim 12, further comprising a molding member surrounding the light emitting device.

14. A lighting system comprising:
a light emitting module including a substrate and the light emitting device as claimed in claim 1, wherein the light emitting device is provided on the substrate.

15. The light emitting device as claimed in claim 1, wherein a bandgap of the first plurality of sub-quantum well layers is equal to the bandgap of the second plurality of sub-quantum well layers.

16. The light emitting device as claimed in claim 1, wherein a thickness of the barrier layer is greater than a thickness of the first and the second sub-barrier layers.

17. A light emitting device comprising:
a first conductive semiconductor layer;
an active layer adjacent to the first conductive semiconductor layer to emit light, the active layer including a first quantum well layer, a second quantum well layer and a barrier layer; and
a second conductive semiconductor layer adjacent to the active layer,
wherein the barrier layer includes a first plurality of sub-barrier layers and a first plurality of sub-quantum well layers,
wherein the first quantum well layer includes a second plurality of sub-barrier layers and a second plurality of sub-quantum well layers,
wherein a bandgap of the first plurality of sub-barrier layers is greater than a bandgap of the second plurality of sub-barrier layers, and
wherein a bandgap of the first plurality of sub-quantum well layers is equal to a bandgap of the second plurality of sub-quantum well layers.

18. The light emitting device as claimed in claim 17, wherein the first plurality of sub-barrier layers are divided into first to $n^{th}$ sub-barrier layers that are sequentially stacked beginning from the first sub-barrier layer, and the plurality of sub-quantum well layers are divided into first to $n^{th}$ sub-quantum well layers that are sequentially stacked beginning from the first sub-quantum well layer, wherein the sub-quantum well layers have band gaps that are lower than band gaps of the sub-barrier layers.

19. The light emitting device as claimed in claim 18, wherein the sub-quantum well layers have a region where an amount of indium (In) injected into the sub-quantum well layers increases based on a stacking sequence of the sub-quantum well layers.

20. The light emitting device as claimed in claim 17, wherein the barrier layer has a thickness of approximately 80 Å to 120 Å, and the quantum well layer has a thickness of approximately 20 Å to 40 Å.

21. A light emitting device package comprising:
the light emitting device as claimed in claim 17,
a body; and
first and second electrode layers on the body,
wherein the light emitting device is electrically coupled to the first electrode layer and the second electrode layer on the body.

22. The light emitting device package as claimed in claim 21, further comprising a molding member surrounding the light emitting device.

23. A lighting system comprising:
a light emitting module including a substrate and the light emitting device as claimed in claim 17, wherein the light emitting device is provided on the substrate.

* * * * *